United States Patent
Huang et al.

(10) Patent No.: US 10,707,361 B2
(45) Date of Patent: Jul. 7, 2020

(54) QE APPROACH BY DOUBLE-SIDE, MULTI ABSORPTION STRUCTURE

(71) Applicant: Taiwan Semiconductor Manufacturing Co., Ltd., Hsin-Chu (TW)

(72) Inventors: Po-Han Huang, Tainan (TW); Chien Nan Tu, Kaohsiung (TW); Chi-Yuan Wen, Tainan (TW); Ming-Chi Wu, Kaohsiung (TW); Yu-Lung Yeh, Kaohsiung (TW); Hsin-Yi Kuo, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/580,350

(22) Filed: Sep. 24, 2019

(65) Prior Publication Data

US 2020/0020816 A1 Jan. 16, 2020

Related U.S. Application Data

(62) Division of application No. 15/716,714, filed on Sep. 27, 2017, now Pat. No. 10,553,733.

(Continued)

(51) Int. Cl.
*H01L 31/0232* (2014.01)
*H01L 27/146* (2006.01)
(Continued)

(52) U.S. Cl.
CPC ...... *H01L 31/0232* (2013.01); *H01L 27/1463* (2013.01); *H01L 27/1464* (2013.01);
(Continued)

(58) Field of Classification Search
CPC .......... H01L 31/0232; H01L 31/02002; H01L 27/307
See application file for complete search history.

(56) References Cited

U.S. PATENT DOCUMENTS 8,816,358 B1 8/2014 Tsai et al.
9,293,629 B2 3/2016 Wicke
(Continued)

FOREIGN PATENT DOCUMENTS

JP 2013033864 A 2/2013

OTHER PUBLICATIONS

University of Kaiserslautern, Department of Physics. "Photonic Crystals in the Terahertz Spectral Range." Unknown publication date. Retrieved online on Nov. 29, 2016 at https://www.physik.uni-kl.de/en/beigang/forschungsprojekte/photonische-kristalle/.
(Continued)

*Primary Examiner* — Marc Anthony Armand
(74) *Attorney, Agent, or Firm* — Eschweiler & Potashnik, LLC

(57) ABSTRACT

The present disclosure relates to an integrated chip that has a light sensing element arranged within a substrate. An absorption enhancement structure is arranged along a back-side of the substrate, and an interconnect structure is arranged along a front-side of the substrate. A reflection structure includes a dielectric structure and a plurality of semiconductor pillars that matingly engage the dielectric structure. The dielectric structure and semiconductor pillars are arranged along the front-side of the substrate and are spaced between the light sensing element and the interconnect structure. The plurality of semiconductor pillars and the dielectric structure are collectively configured to reflect incident light that has passed through the absorption enhancement structure and through the light sensing element (Continued)

Fig. 2 back towards the light sensing element before the incident light strikes the interconnect structure.

20 Claims, 10 Drawing Sheets

Related U.S. Application Data

(60) Provisional application No. 62/427,650, filed on Nov. 29, 2016.

(51) Int. Cl.
*H01L 27/30* (2006.01)
*H01L 31/02* (2006.01)
*H01L 31/0224* (2006.01)

(52) U.S. Cl.
CPC .. *H01L 27/14603* (2013.01); *H01L 27/14629* (2013.01); *H01L 27/14685* (2013.01); *H01L 27/307* (2013.01); *H01L 31/02002* (2013.01); *H01L 31/0224* (2013.01); *H01L 27/1462* (2013.01); *H01L 27/14612* (2013.01); *H01L 27/14621* (2013.01); *H01L 27/14627* (2013.01)

(56) References Cited

U.S. PATENT DOCUMENTS

| 9,536,914 | B2 | 1/2017 | Huang et al. |
| 9,997,645 | B2 | 6/2018 | Tsukagoshi |
| 2011/0186951 | A1 | 8/2011 | Pyo |
| 2013/0134535 | A1 | 5/2013 | Lenchenkov |
| 2015/0279885 | A1 | 10/2015 | Tu |
| 2017/0040357 | A1* | 2/2017 | Yu .............. H01L 27/1463 |
| 2017/0110493 | A1 | 4/2017 | Yokogawa |

OTHER PUBLICATIONS

Non-Final Office Action dated Jun. 11, 2019 for U.S. Appl. No. 15/716,714.
Final Office Action dated Sep. 19, 2019 for U.S. Appl. No. 15/716,714.
Notice of Allowance dated Nov. 15, 2019 for U.S. Appl. No. 15/716,714.

* cited by examiner

QE APPROACH BY DOUBLE-SIDE, MULTI ABSORPTION STRUCTURE

REFERENCE TO RELATED APPLICATIONS

This Application is a Divisional of U.S. application Ser. No. 15/716,714, filed on Sep. 27, 2017, which claims the benefit of U.S. Provisional Application No. 62/427,650, filed on Nov. 29, 2016. The contents of the above-referenced Patent Applications are hereby incorporated by reference in their entirety.

BACKGROUND

Integrated circuits (IC) with image sensors are used in a wide range of modern day electronic devices, such as cameras and cell phones, for example. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
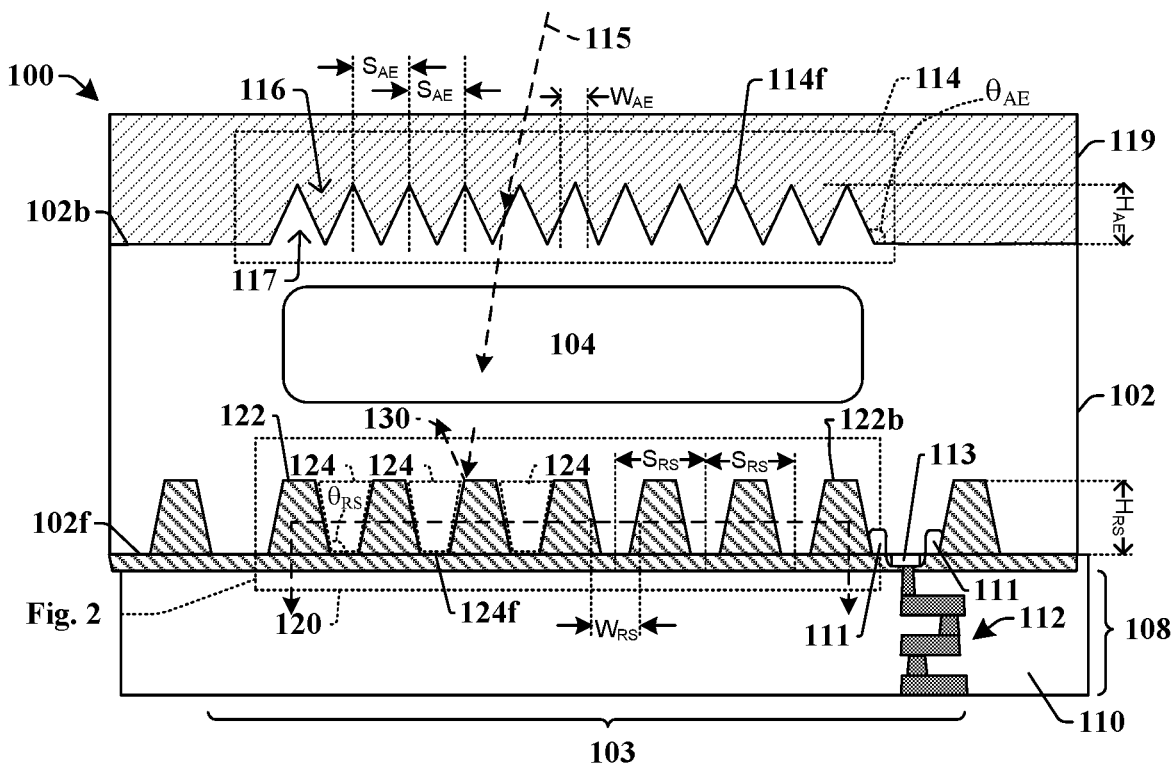
FIG. 1 illustrates a cross-sectional view of some embodiments of an image sensor integrated chip comprising an absorption enhancement structure and a reflection structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors comprise a plurality of pixel regions each having a light sensing element. The plurality of pixel regions and corresponding light sensing elements are arranged in an array so as to collectively sense and/or record an image whose light is spread over the light sensing elements of the array. In recent years, the number of pixel regions in CMOS image sensor (CIS) integrated chips has generally increased. As the number of pixel regions in a CIS integrated chip increases, the resolution of the image captured by the chip also increases. However, as size of pixel regions gets smaller, the amount of light detected by each sensor region tends to decrease. This diminished light intensity can lead to increased sensing times, reduced signal-to-noise margins, and/or other challenges.

In many modern day image sensors, color filters are configured to filter incident light provided to different light sensing elements within a CMOS image sensor chip. For example, a chip may have a first color filter configured to pass red light arranged over a first light sensing element, a second color filter configured to pass blue light arranged over a second light sensing element, etc. It has been appreciated that intervening layers may be arranged between the color filters and the light sensing elements. When adjacent intervening layers have different indices of refraction, the layers may refract (i.e., change in direction of propagation of a light wave) an incident light ray according to Fresnel's equation. If the interface is not planar, the refracted light may be travel in a lateral direction and ultimately be directed away from the desired image sensor, further reducing the light intensity of the image to be sensed.

The present disclosure relates to an image sensor integrated chip that includes a light sensing element, such as a photodiode for example, arranged within a substrate. The image sensor integrated chip is configured to receive incident light through a back-side of the substrate. To increase the amount of light absorbed by the light sensing element, an absorption enhancement structure is disposed between the back-side of the substrate and the light sensing element. Further, a reflection structure, which comprises a series of semiconductor or dielectric pillars, is arranged between the light sensing element and a front-side of the substrate. Thus, the light sensing element is "sandwiched" between the absorption enhancement structure and the reflection structure to increase the amount of light absorbed.

Accordingly, during operation, incident light is received through the back-side of the substrate, and passes through the absorption enhancement structure before some, but not all, of the incident light is absorbed by the light sensing element. The remaining light that is not absorbed by the light sensing element passes by the light sensing element and strikes the reflection structure. The reflection structure redirects at least some of the un-absorbed light back towards the light sensing element. Some of the reflected light is then absorbed by the light sensing element, such that the reflection structure helps to improve the percentage of incident light measured by the image sensor device.

FIG. 1 illustrates a cross-sectional view of some embodiments of an image sensor integrated chip 100 comprising an absorption enhancement structure 114 and a reflection structure 120.

The integrated image sensor integrated chip 100 comprises a semiconductor substrate 102 having a pixel region 103. The pixel region 103 comprises a light sensing element 104 configured to convert incident light 115 (e.g., photons) into an electric signal (i.e., to generate electron-hole pairs from the incident light). In some embodiments, the light sensing element 104 may comprise a photodiode. In some embodiments, the pixel region 103 may be arranged within the semiconductor substrate 102 as part of an array comprising rows and/or columns.

A back-end-of-the-line (BEOL) metallization stack 108 is arranged along a front-side 102f of the semiconductor substrate 102. The BEOL metallization stack 108 comprises an interconnect dielectric structure 110 surrounding a plurality of conductive interconnect layers 112. The interconnect dielectric structure 110 comprises a plurality of stacked inter-level dielectric (ILD) layers. A gate electrode 113 and source/drain regions 111 of a transfer transistor, which controls when pent-up charge stored in the pixel region 103 is sensed, are also disposed in or over the front-side 102f of the semiconductor substrate 102.

The absorption enhancement structure 114 is arranged along a back-side 102b of the semiconductor substrate 102. The absorption enhancement structure 114 is configured to increase the quantum efficiency of the underlying light sensing element 104 by improving the absorption of photons by the light sensing element 104. In some embodiments, the absorption enhancement structure 114 may be configured to increase quantum efficiency by modifying properties of incident light 115 that is transmitted to the light sensing element 104. For example, in some embodiments, the semiconductor substrate 102 is a monocrystalline silicon substrate, and the absorption enhancement structure 114 corresponds to one or more recesses 116 in the back-side 102b of the semiconductor substrate 102 and corresponding protrusions 117 that matingly engage the recesses 116. The recesses are filled with dielectric material 119, such as a silicon dioxide layer that matingly engages the protrusions 117. The protrusions 117 are a part of the substrate (e.g., are made of monocrystalline silicon), or alternatively are made from a layer of amorphous or polycrystalline silicon formed by chemical vapor deposition, plasma vapor deposition, etc., on the back-side 102b of the substrate. In some embodiments, the protrusions 117 are arranged at regularly spaced intervals and/or are arranged in a periodic pattern. The interface 114f at which the recesses 116 and protrusions 117 meet helps to redirect incident light 115 through the semiconductor substrate 102 and towards the light sensing element 104. In some embodiments, the protrusions 117 are circular, oval, rectangular, and/or square (often with rounded corners), as viewed from above, and may comprise angled sidewalls. The recesses 116 and protrusions 117 establish a topography that increases absorption of incident light 115 by the semiconductor substrate 102 (e.g., by reducing a reflection of light from the non-planar surface). In some embodiments a height, $H_{AE}$, of each protrusion 117 can range from 200 nm to 1000 nm; and width, $W_{AE}$, of each protrusion can each range from 100 nm to 500 nm. Centers of the protrusions 117, which can correspond to a peak or discontinuity, can be spaced according to a pitch or spacing, $S_{AE}$, ranging from approximately 200 nm to 1000 nm in some embodiments.

A reflection structure 120 is arranged along the front-side 102f of the semiconductor substrate 102, and is arranged between the light sensing element 104 and the BEOL metallization stack 108. Thus, relative to the absorption enhancement structure 114, the reflection structure 120 is arranged on an opposite side of the light sensing element 104. The reflection structure 120 includes a series of depressions 122 which extend into the front-side 102f of the semiconductor substrate 102. These depressions 122 are then filled with a material whose refractive index differs from that of the substrate. For example, in some embodiments the depressions 122 are filled with a dielectric material, such as silicon dioxide, that takes the form of a grid-like structure that surrounds a series of semiconductor pillars 124. The pillars 124 extend fully under the surface area of light sensing element 104. Due to their widths, spacings, and/or material composition, these pillars 124 in combination with the filled depressions 122 are configured to reflect incident light 115, which has passed from the back-side 102b through the light sensing element 104, back towards the light sensing element 104 (see arrow 130). In some embodiments, the pillars 124 are in the shape of a cone, frustum cone, pyramid, frustum pyramid, cylinder, cube, or box, among others. In some embodiments, the front surface of a pillar 124f has a width which is less than that of a front surface of an active area of the substrate corresponding to gate electrode 113. Further, in some embodiments, the width of the front surface of a pillar 124f is the same as that of the bottommost surface of a depression 122b, such that the pillars 124 and depressions 122 are inverted but have cross-sections that are congruous in other regards.

Figure 2:
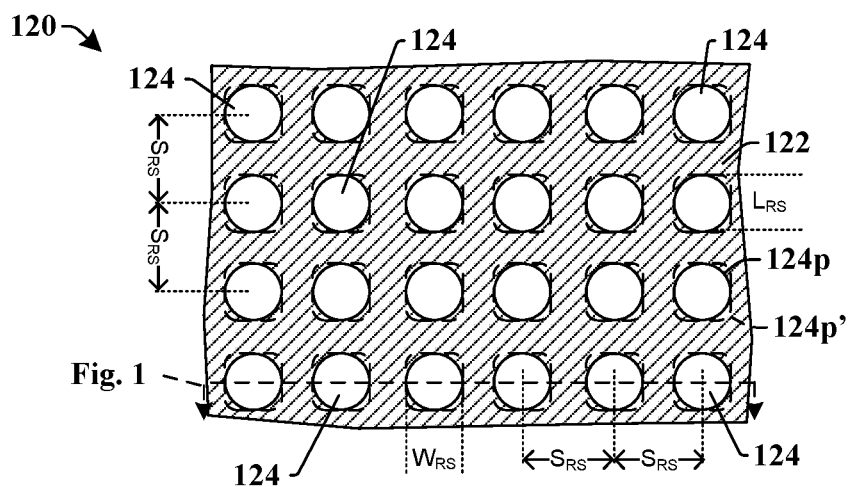
FIG. 2 illustrates a top view of some embodiments of an image sensor integrated chip comprising an absorption enhancement structure and a reflection structure, which are arranged on opposite sides of a light sensing element.

Referring now to FIGS. 1-2 concurrently, in some embodiments the pillars 124 have equal heights, $H_{RS}$, as measured from the front-side 102f of the substrate; have equal widths, $W_{RS}$, (e.g., equal diameters for circular shapes) as viewed from above and as measured at a half-maximum depth of the pillar 124; and/or have equal lengths, $L_{RS}$, (e.g., equal diameters for circular shapes) as viewed from above and as measured at a half-maximum depth of the pillar. Further, in some embodiments, centers of neighboring pillars are spaced at an equal spacing interval, $S_{RS}$, to define a pitch at which the pillars are arranged, such that a minimum spacing between outermost edges of any two pillars is the same over the entire pixel region 103. In some embodiments, $S_{RS}$ can range from approximately 200 nm to 1000 nm. Further, in some embodiments the height of the pillars, $H_{RS}$, can range from 200 nm to 1000 nm. The width of the pillars, $W_{RS}$, and length of the pillars, $L_{RS}$, can each range from 100 nm to 500 nm. The width, $W_{RS}$, can be greater than, equal to, or less than width, $W_{AE}$; while the height $H_{RS}$, can be greater than, equal to, or less than height, $H_{AE}$; and the spacing, $S_{RS}$, can be greater than, equal to, or less than spacing, $S_{AE}$. The sidewall angle, $\theta_{RS}$ is less than the sidewall angle $\theta_{AE}$ in the illustrated embodiment, but in other embodiments $\theta_{RS}$ is greater than or equal to the sidewall angle $\theta_{AE}$.

As shown in FIG. 2, the pillars 124 may have an outer perimeter that is circular (e.g., 124$p$), square, polygonal, or square-like with rounded corners (e.g., 124$p'$) when viewed from above. In some other embodiments, pillars can also have different depths, different lengths, and/or different widths from other pillars within a given pixel region and/or over the chip, and different minimum spacings can also be present between neighboring pillars within a given pixel region 103 and/or over the chip. For example, pillars can have random depths, lengths, widths, and/or spacings, or can have depths, lengths, widths, or spacings that are different according to a predetermined pattern.

Figure 3:
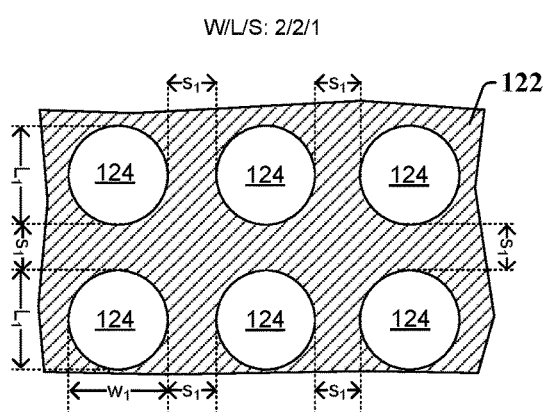
FIGS. 3-6 illustrate some top views of some additional embodiments of reflection structures.
Figure 4:
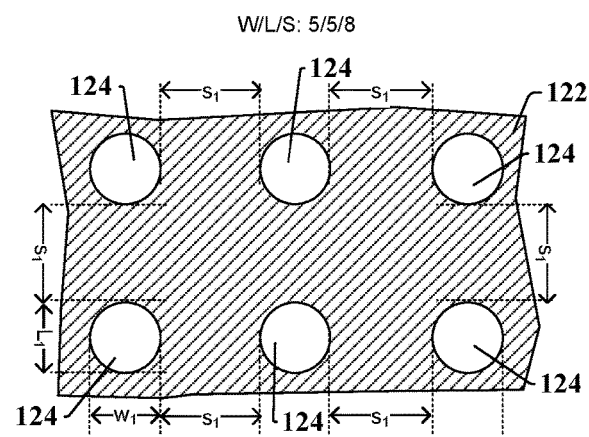

The ratios between the width, length and spacing ($W_1$/$L_1$/$S_1$) of the pillars 124 can vary depending on the design constraints, including for example, which wavelengths of light are to be reflected back towards the light sensing element 104 and/or attenuated/filtered out from being reflected back towards the light sensing element 104. FIG. 3 shows an advantageous embodiment where the ratio of $W_1$/$L_1$/$S_1$ is approximately 2/2/1, while FIG. 4 shows an example where the ratio of $W_1$/$L_1$/$S_1$ is approximately 5/5/8. Thus, in some embodiments, such as shown in FIG. 3 for example, each pillar 124 can have a width, $W_1$, which is greater than a minimum spacing, $S_1$, between pillars; while in other embodiments, such as shown in FIG. 4 for example, each pillar 124 can have a width, $W_1$, which is less than a minimum spacing, $S_1$, between pillars.

Figure 5:
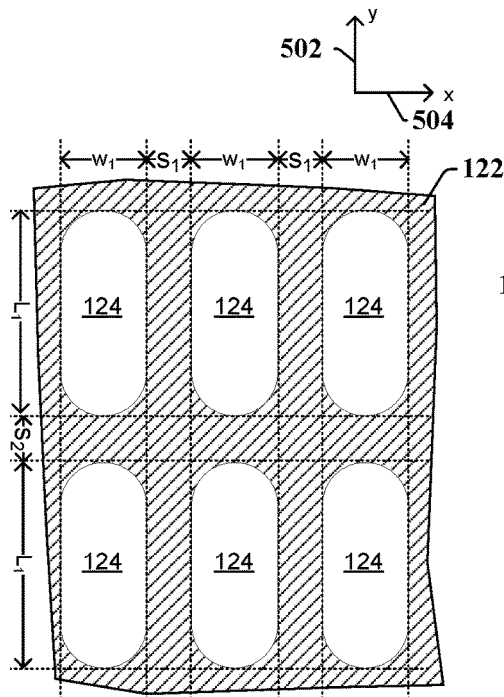

FIG. 5 shows another example where pillars 124 are elongated along a first axis 502 as viewed from above. Thus, in FIG. 5, the pillars have a length, $L_1$, as measured along the first axis 502, and a width, $W_1$, on measured on a second axis 504 that is perpendicular to the first axis. The length $L_1$ is greater than the width $W_1$. Further, a first minimum spacing $S_1$ is measured along the first axis between adjacent sidewalls of neighboring pillars 124, and a second minimum spacing $S_2$, which can be greater than, equal to, or less than the first minimum spacing, $S_1$, is measured along the second axis between adjacent sidewalls of neighboring pillars 124.

Figure 6:
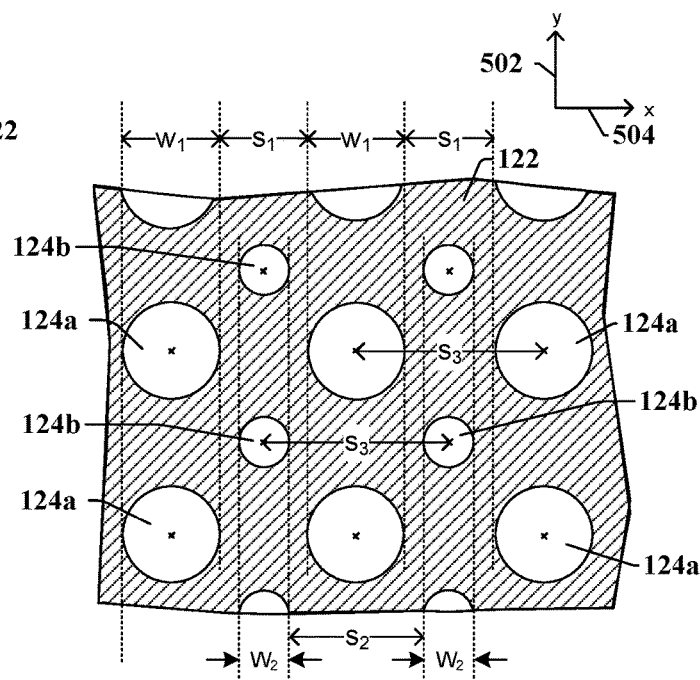

FIG. 6 shows another non-limiting example where pillars have different sizes. In FIG. 6's example, a first subset of the pillars 124$a$ each have a first width, $W_1$, and have sidewalls that are spaced apart by a first minimum spacing $S_1$; while a second subset of pillars 124$b$ each have a second width, $W_2$, and have sidewalls that are spaced apart by a second minimum spacing, $S_2$, which differs from the first minimum spacing. The first width, W1 is illustrated as being larger than the second width, W2, for example, 5% to 400% larger. In FIG. 6's embodiment, centers of the pillars 124$a$, 124$b$ are spaced apart at an equal interval, $S_1$, for both the first subset of pillars 124$a$ and the second subset of pillars 124$b$, such that centers of the pillars 124$a$, 124$b$ are arranged according to a uniform pitch over the entire pixel region. Though FIG. 6 shows only two sizes of pillars (124$a$, 124$b$), more than two sizes of pillars can also be present, depending on the implementation.

Figure 7:
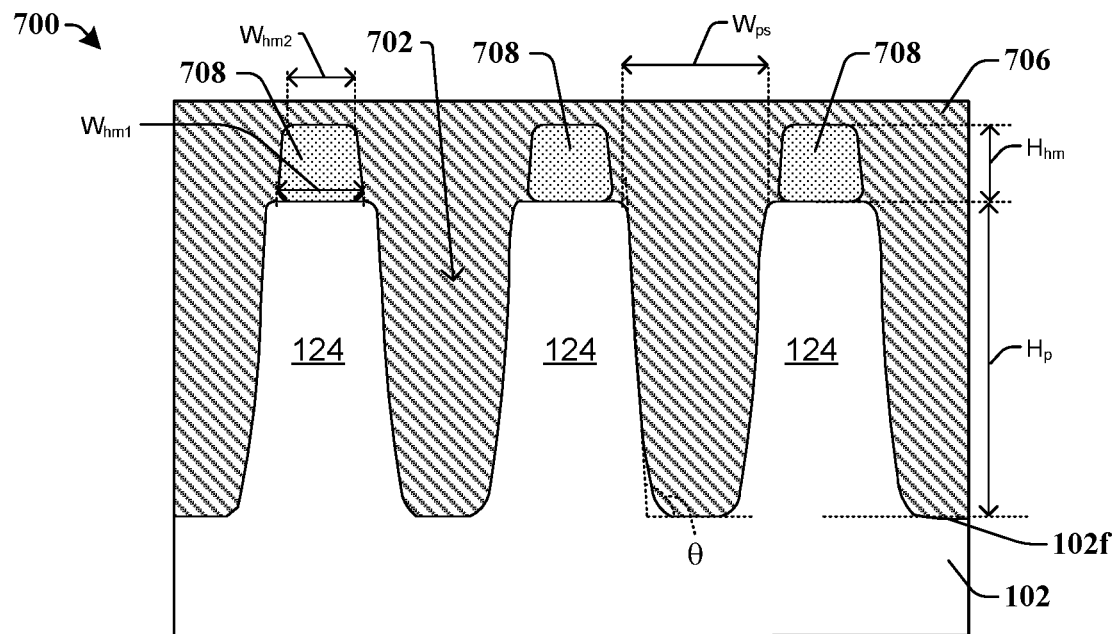
FIG. 7 illustrates a cross-sectional view of some embodiments of a reflection structure.

FIG. 7 shows a cross-sectional view of a reflection structure 700 whose orientation on the page has been flipped relative to that of the previous figures. Thus, FIG. 7 is "upside down" relative to FIG. 1. The reflection structure 700 includes depressions or trenches 702 disposed in a front-side 102$f$ of the semiconductor substrate 102 and which leave pillars 124 of doped silicon extending from a face of the semiconductor substrate 102. The depressions 702 are filled with a material 706, such as silicon dioxide for example, whose refractive index differs from that of the semiconductor substrate 102. A hardmask 708, such as a silicon nitride hardmask, is optionally present over top over the pillars 124. In some embodiments, during manufacture of the device, the hardmask 708 covers the upper surface of the substrate, and an etch is carried out with the hardmask in place to form the trenches 702 and leave the pillars 124 in place. Because of this, in some cases the hardmask 708 may remain in place in the final chip, but in other embodiments, such as depicted in FIG. 1 (and FIG. 8 hereinafter), the hardmask 708 has been removed after the etch is performed. In some embodiments, the hardmask 708 can have a height, $H_{hm}$, of approximately 100 nm, a first width, $W_{hm1}$, at its base portion of between 140 nm-150 nm, and a second width, $W_{hm2}$, at its top portion of between 90 nm and 100 nm. Further, the pillars can have a height, $H_p$, ranging from approximately 400 nm-410 nm, and can have upper portions that are spaced apart by a pillar spacing, $W_{ps}$, ranging between 180 nm and 190 nm. Of course, the dimensions described here are only examples, and do not limit the scope of the disclosure in any way. Although FIG. 1 (and FIG. 8 hereinafter) do not depict a hardmask over pillars 124, it will be appreciated that such a hardmask can be present in alternate embodiments.

Figure 8:
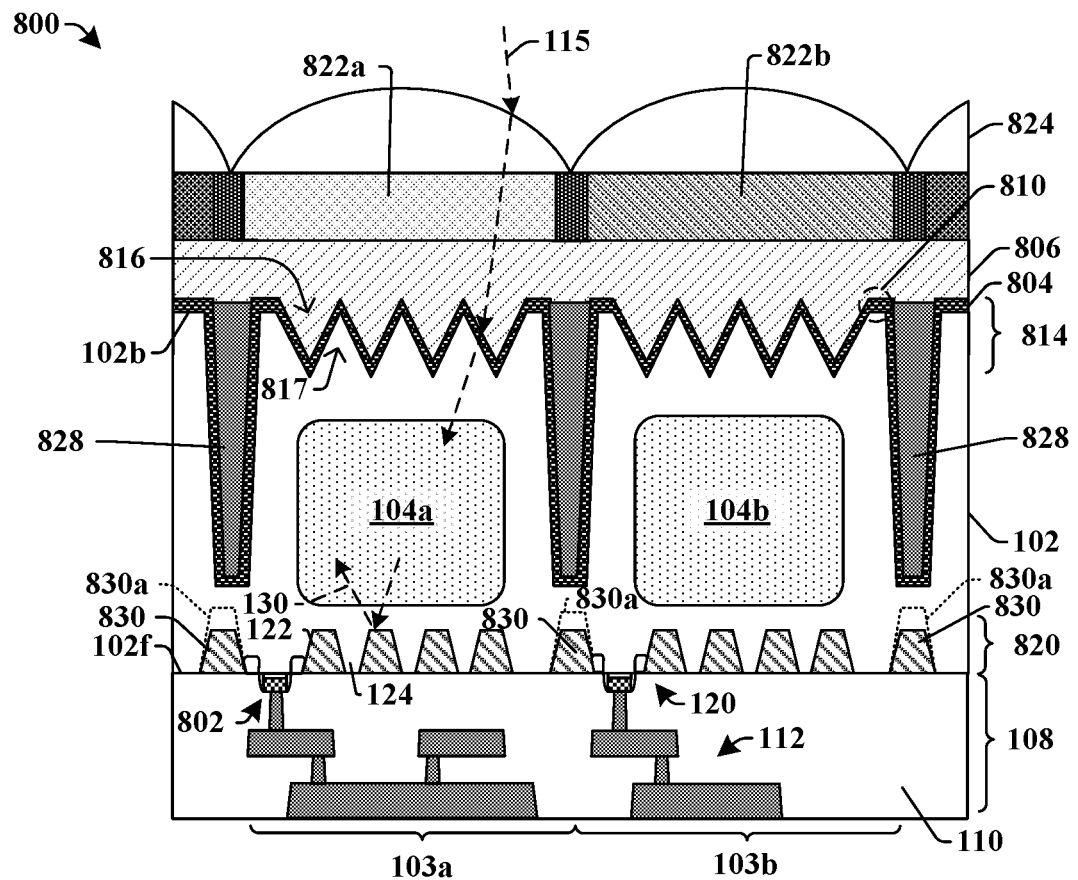
FIG. 8 illustrates a cross-sectional view of some embodiments of an image sensor integrated chip comprising an absorption enhancement structure and a reflection structure, which are arranged on opposite sides of a light sensing element. The image sensor integrated chip also includes a color filter array and a lens arranged over the absorption enhancement structure.

FIG. 8 illustrates a cross-sectional view of some additional embodiments of an image sensor integrated chip 800 comprising an absorption enhancement structure 814 and a reflection structure 120 in accordance with some embodiments.

The image sensor integrated chip 800 comprises a semiconductor substrate 102 having a plurality of pixel regions 103$a$, 103$b$, respectively having light sensing elements 104$a$, 104$b$, respectively, configured to convert incident light 115 into an electric signal. A plurality of transistors 802 are arranged along the front-side 102$f$ of the semiconductor substrate 102. In some embodiments, the plurality of transistors 802 may comprise a transfer transistor configured to transfer charges generated by the light sensing elements 104$a$, 104$b$ as the electrical signal.

A BEOL metallization stack 108 comprising an interconnect dielectric structure 110 and a plurality of conductive interconnect layers 112 is arranged along the front-side 102$f$ of the semiconductor substrate 102. The interconnect dielectric structure 110 comprises one or more stacked inter-level dielectric (ILD) layers. In various embodiments, the ILD layers may comprise one or more of a low-k dielectric layer (i.e., a dielectric with a dielectric constant less than about 3.9), an ultra-low-k dielectric layer, or an oxide (e.g., silicon oxide). The plurality of conductive interconnect layers 112 comprise alternating layers of metal wires and metal vias. In various embodiments, the plurality of conductive interconnect layers 112 may comprise a conductive metal such as copper, aluminum, and/or tungsten, for example.

An absorption enhancement structure 814 is arranged along a back-side 102$b$ of the semiconductor substrate 102. In some embodiments, the absorption enhancement structure 814 includes a non-planar surface interface on the back-side 102$b$ of the semiconductor substrate 102. This non-planar surface interface includes a plurality of recesses 816 disposed in the back-side 102$b$ of the semiconductor substrate 102, and a plurality of corresponding protrusions 817 that matingly engage the recesses 816. The protrusions 817 are made of monocrystalline silicon or a layer of amorphous or polycrystalline silicon. In some embodiments, the recesses 816 may be filled with a dielectric material 806, such as silicon dioxide or high-k dielectric for example.

In some embodiments, the plurality of recesses 816 may comprise conical shaped depressions arranged over the light sensing elements 104a, 104b. In other embodiments, the plurality of recesses 816 may comprise pyramid shaped depressions having a width that decreases as a distance from the light sensing elements 104a, 104b decreases. The plurality of recesses 816 may have a saw-tooth shaped profile that alternates between peaks and valleys. In some embodiments, the saw-tooth profile may be arranged between horizontal planar ledges 810 arranged along a perimeter of pixel regions, 103a-103b.

A grid structure 828 comprises sidewalls that define an opening overlying the light sensing elements 104a, 104b. The grid structure 828 vertically extends from a top surface over the absorption enhancement structure 814 to a bottom surface that is below an uppermost point of the semiconductor substrate 102 (e.g., a peak of the semiconductor substrate 102). In some embodiments, the bottom surface of the grid structure 828 is substantially aligned with the planar ledges 810 arranged along the perimeter of the pixel regions, 103a-103b. In some embodiments, the grid structure 828 may comprise a metal. For example, the grid structure 828 may comprise aluminum.

In some embodiments, an anti-reflective layer 804 lines the back-side 102b of the semiconductor substrate 102. In some embodiments, the anti-reflective layer 804 may further line the depressions and the interior surfaces of the trenches of grid structure. In some embodiments, the anti-reflective layer 804 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. The anti-reflective layer 804 helps to further increase the amount of light that reaches the light sensing elements 104a, 104b.

The absorption enhancement structure 814 modifies the energy of photons that are transmitted to the semiconductor substrate 102. By modifying the energy of photons that are transmitted to the substrate, the absorption of transmitted photons can be increased (e.g., an energy with a high rate of absorption can be transmitted through the absorption enhancement structure 814) thereby increasing charge carriers generated by the light sensing elements 104a, 104b. Furthermore, the absorption enhancement structure 814 may also block the transmission of photons out of the substrate, effectively trapping photons inside the semiconductor substrate 102. The trapped photons are subsequently reabsorbed by the semiconductor substrate 102, which further increases the absorption.

A reflection structure 820 is arranged along a front-side 102f of the semiconductor substrate 102, and thus is arranged between the light sensing elements 104a, 104b and the BEOL metallization stack 108. The reflection structure 820 includes a series of depressions 122 which extend into the front-side of the semiconductor substrate 102, and which leave a series of semiconductor pillars 124 extending from the front-side 102f of the substrate. The depressions are filled with a material whose refractive index differs from that of the substrate. For example, in some embodiments the depressions 122 are filled with a dielectric material, such as silicon dioxide. Due to their widths, spacings, and material composition, the pillars 124 and the material filling the depressions are configured to reflect incident light that has passed through the light sensing elements back towards the light sensing elements 104.

In some embodiments, the pixel regions 103a, 103b have outer perimeters that are surrounded by a trench isolation feature, such as a shallow trench isolation (STI) feature or deep trench isolation (DTI) feature, which perimeterally surrounds the individual pixels. Thus, in FIG. 8, the trench isolation structure can correspond to reference numeral 830. In FIG. 8's embodiment, the trench isolation structure, which serves to limit current leakage between adjacent pixels, has the same cross-sectional shape as the depressions 122 (and is also congruous, albeit inverted, with the pillars 124). This is advantageous because the trench isolation structure 830 and pillars 124 can be formed in one mask step. However, in other embodiments, the trench isolation structure 830 can have a different cross-sectional shape than the depressions 122. For example, sidewalls of isolation structure can be more widely spaced apart than those of the depressions 122, depths of trench isolation structures can differ from those of the depressions 122 (e.g., depth of trench structure can be deeper than depressions 122, as shown by 830a), and/or the trench isolation structure can have more complicated surface geometries, for example, be multifaceted or bulbous in shape, compared to those of the depressions 122 and/or pillars 124. This may utilize multiple masks, but provides greater fine-tuning of functions for trench isolation structure 830 and pillars 124.

A plurality of color filters, 822a-822b, are arranged over the back-side 102b of the semiconductor substrate 102. The plurality of color filters, 822a-822b, are respectively configured to transmit specific wavelengths of incident light 115. For example, a first color filter 822a (e.g., a red color filter) may transmit light having wavelengths within a first range, while a second color filter 822b may transmit light having wavelengths within a second range different than the first range. A plurality of micro-lenses 824 are arranged over the plurality of color filters, 822a-822b. Respective micro-lenses 824 are laterally aligned with the color filters, 822a-822b, and overlie the pixel regions 103a-103b.

The plurality of micro-lenses 824 are configured to focus the incident light 115 (e.g., light) towards the pixel regions 103a-103b. When the incident light 115 strikes an interface between the absorption enhancement structure 814 and the semiconductor substrate 102, a portion of the incident light 115 is refracted as refracted radiation, which travels at an angle that is different than that of the incident light 115. The grid structure 828 surrounds the individual pixels 103a, 103b and is configured to block the refracted radiation from traveling to an adjacent pixel region, thereby reducing cross-talk between adjacent pixel regions 103a-103b. For example, the grid structure 828 blocks refracted radiation generated within the first pixel region 103a from traveling to the second pixel region 103b.

FIGS. 9-20 illustrate cross-sectional views 900-2000 of some embodiments of a method of forming an image sensor integrated chip comprising a reflective structure. Although the cross-sectional views 900-2000 shown in FIGS. 9-20 are described with reference to a method of forming reflective structure for an image sensor integrated chip, it will be appreciated that the structures shown in FIGS. 9-20 are not limited to the method of formation but rather may stand alone separate of the method. Furthermore, although the method describes the formation of a back-side image (BSI) sensor, it will be appreciated that the disclosed reflective structure may also be used with front-side image (FSI) sensors. Further still, the order of the acts or steps depicted is not limiting, and the acts or steps can be carried out in other orders with additional acts or steps being added or with illustrated acts or steps being omitted, depending on the implementation.

Figure 9:
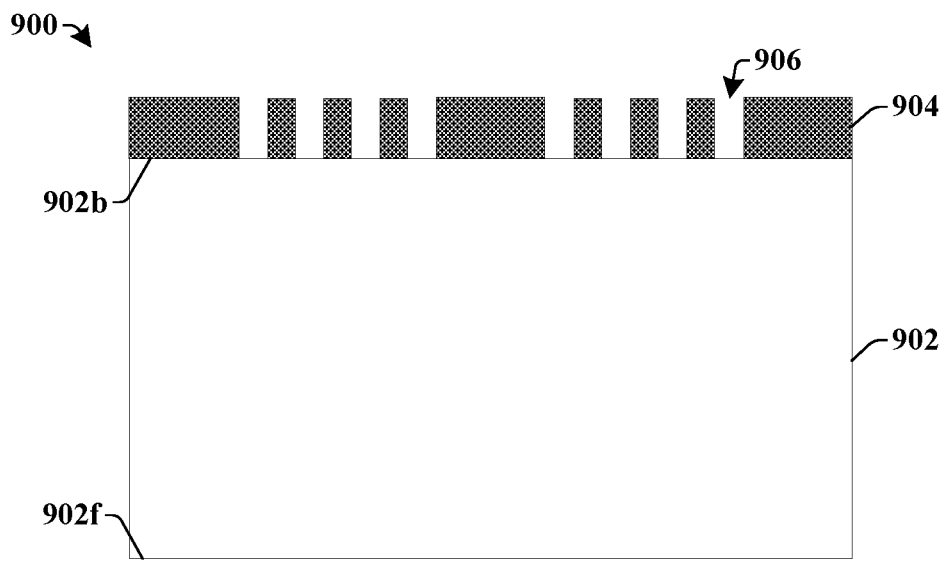
FIGS. 9-20 illustrate cross-sectional views of some embodiments of a method of forming an image sensor integrated chip having an absorption enhancement structure and a reflection structure which are arranged on opposite sides of a light sensing element.

As shown in cross-sectional view 900 of FIG. 9, a first patterned masking layer 904 is formed along a back-side 902b of a substrate 902, while a front-side 902f of the substrate 902 remains uncovered. The substrate 902 may be any type of semiconductor body (e.g., silicon, SiGe, SOI, etc.), as well as any other type of semiconductor and/or epitaxial layers, associated therewith. For example, in some embodiments, the substrate 902 may comprise a base substrate and an epitaxial layer. The first patterned masking layer 904 comprises sidewalls defining openings 906 arranged over the substrate 902. In some embodiments, the first patterned masking layer 904 may be formed by depositing a layer of photosensitive material (e.g., a positive or negative photoresist) over the substrate 902. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define openings 906 within the photosensitive material by removing the soluble regions.

Figure 10:
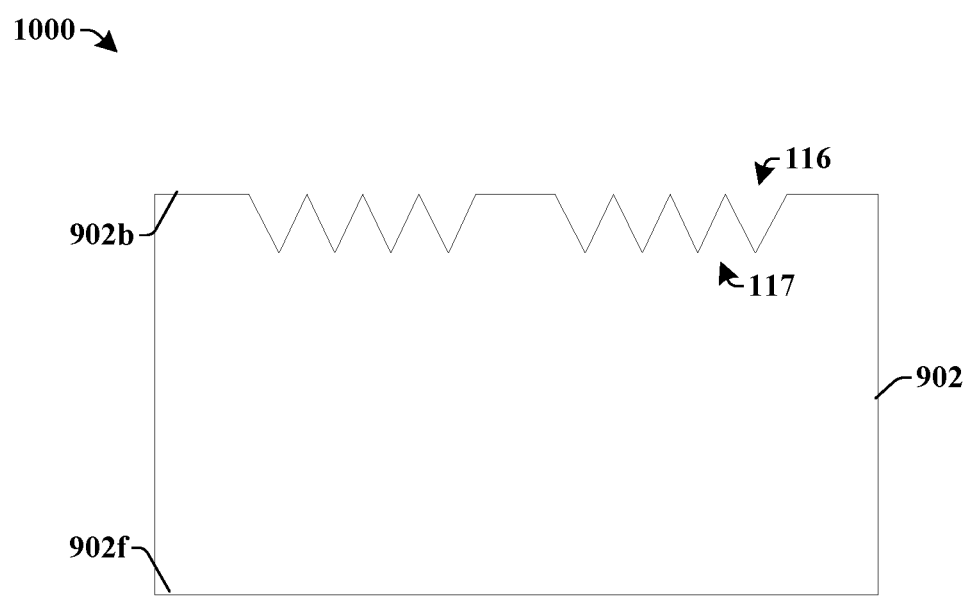

As shown in cross-sectional view 1000 of FIG. 10, a first etching process is performed on the back-side 902b of the substrate 902 according to the first patterned masking layer (904 of FIG. 9). The first etching process is performed by exposing the substrate 902 to one or more etchants with the first patterned masking layer in place. The one or more etchants remove parts of the substrate 902 to define a plurality of recesses 116 in the substrate 902, thereby leaving a series of protrusions 117 extending from a recessed portion of the back-side 902b. In some embodiments, the first etching process may comprise a dry etching process. For example, the first etching process may comprise a coupled plasma etching process, such as an inductively coupled plasma (ICP) etching process or a capacitively coupled plasma (CCP) etching process. In other embodiments, the first etching process may comprise a wet etching process.

Figure 11:
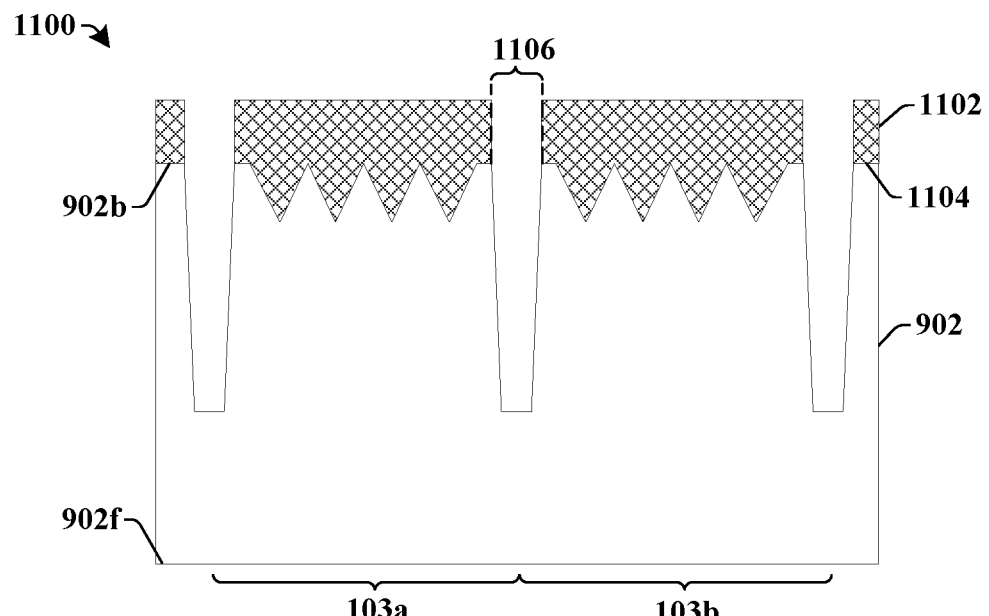

As shown in cross-sectional view 1100 of FIG. 11, a second etching process is performed on the back-side 902b of the substrate 902 according to a second patterned masking layer 1102. The second etching process is performed by exposing unmasked regions of the substrate 902 to one or more etchants, which remove parts of the substrate 902 in unmasked regions to define trenches 1106 within the substrate 902. In some embodiments, the trenches 1106 may be arranged over flat surfaces 1104 of the substrate 902. In some embodiments, the trenches 1106 comprise tapered sidewalls that cause a width of the trenches 1106 to respectively decrease as a distance from the second side 902b of the substrate 902 increases. The trenches 1106 can perimeterally surround individual pixels regions 103a, 103b in the substrate.

Figure 12:
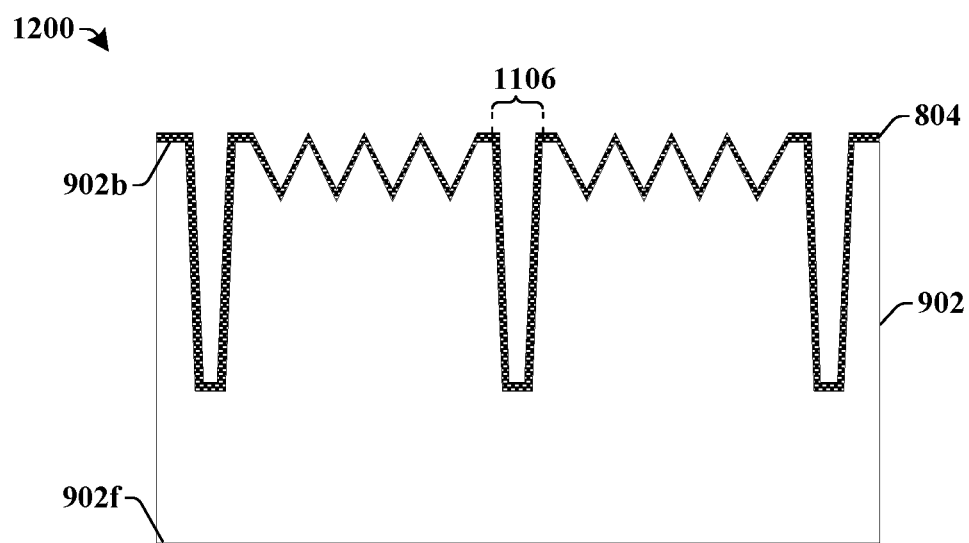

As shown in cross-sectional view 1200 of FIG. 12, an anti-reflective layer 804 is formed along the back-side 902b of the substrate 902. The anti-reflective layer 804 lines the back-side 902b of the substrate 902. In some embodiments, the anti-reflective layer 804 may further line interior surfaces of the trenches 1106. In some embodiments, the anti-reflective layer 804 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the anti-reflective layer 804 may be deposited by a physical vapor deposition technique (e.g., PVD, CVD, PE-CVD, ALD, etc.).

Figure 13:
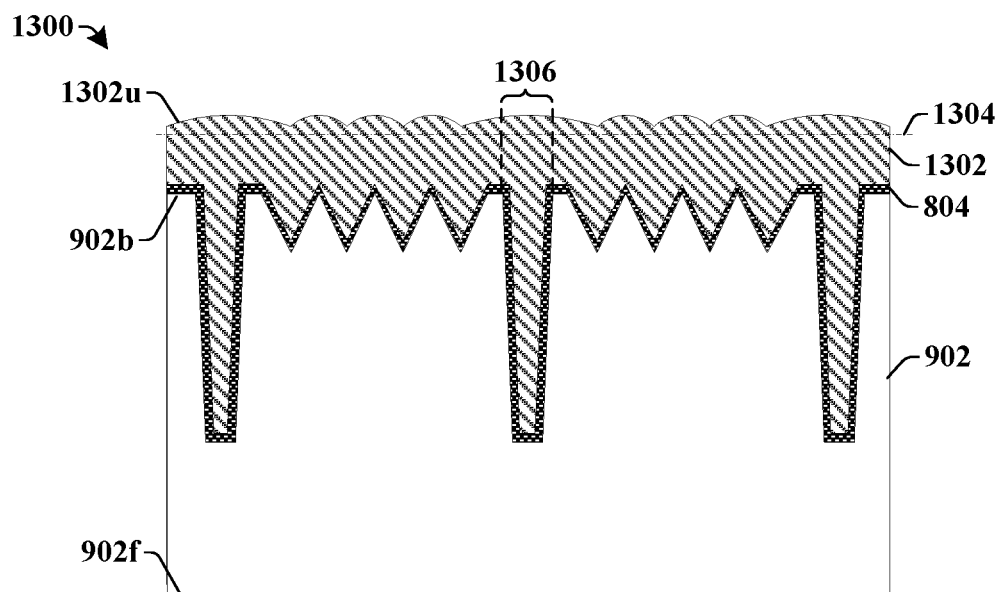

As shown in cross-sectional view 1300 of FIG. 13, a layer of dielectric material 1302 is formed over the anti-reflective layer 804. In various embodiments, the layer of dielectric material 1302 may comprise an oxide (e.g., silicon oxide), TEOS, etc. In some embodiments, the layer of dielectric material 1302 may fill the recesses 116 and may also include dielectric structures, which are ring-like as viewed from above, that fill the trenches 1306. The layer of dielectric material 1302 may be deposited to have an upper surface 1302u comprising a plurality of curved surfaces arranged over the protrusions 117 and intersecting one another. In some embodiments, the plurality of curved surfaces may be removed by a subsequent planarization process (e.g., a chemical mechanical planarization process) to form a substantially planar surface along line 1304.

Figure 14:
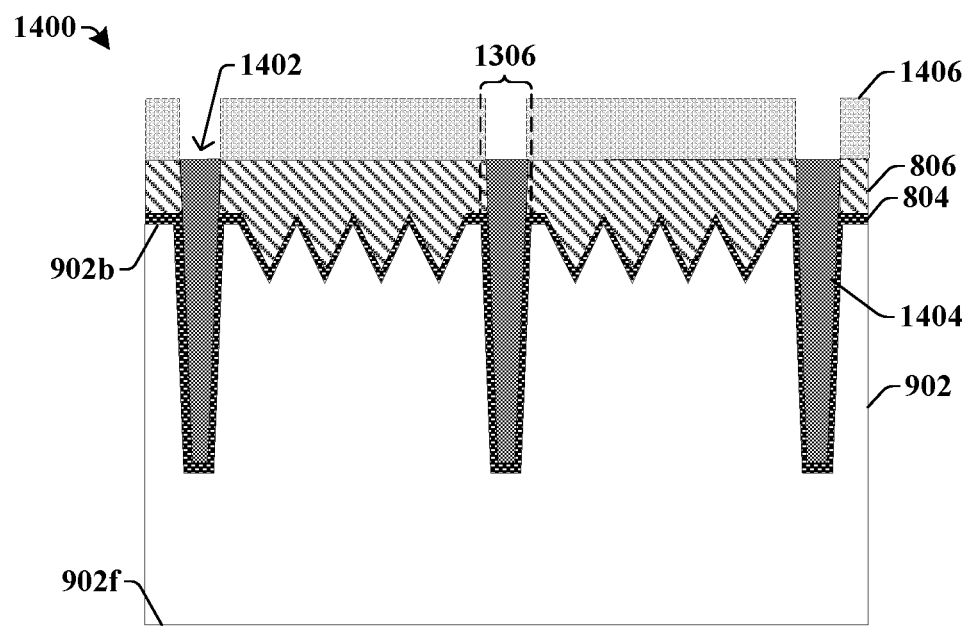

As shown in cross-sectional view 1400 of FIG. 14, a third etching process is performed with another masking structure 1406 in place to remove the ring-like structures of dielectric material 1302 from over and/or within upper portions of the trenches 1306. The removal of the layer of dielectric material 1302 from within the trenches 1306 results in cavities 1402 within the trenches 1306. The cavities 1402 are subsequently filled with one or more reflective filler materials 1404. In various embodiments, the one or more reflective filler materials 1404 may comprise metal, such as aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr), and/or combinations thereof.

In some embodiments, the one or more reflective filler materials 1404 may not fill an entirety of the cavities 1402, resulting in one or more reflective regions comprising the one or more reflective filler materials 1404 and a reflective region comprising an air gap. For example, in some embodiments, the trenches 1306 may have curved sidewalls that define an opening along a top surface of the substrate 902, which has a smaller width that an underlying region of the cavities 1402. When the one or more reflective filler materials 1404 are deposited into the cavities 1402, the one or more reflective filler materials 1404 may close the opening prior to filling an entirety of the cavities 1402, resulting in an air gap within the trenches 1306.

Figure 15:
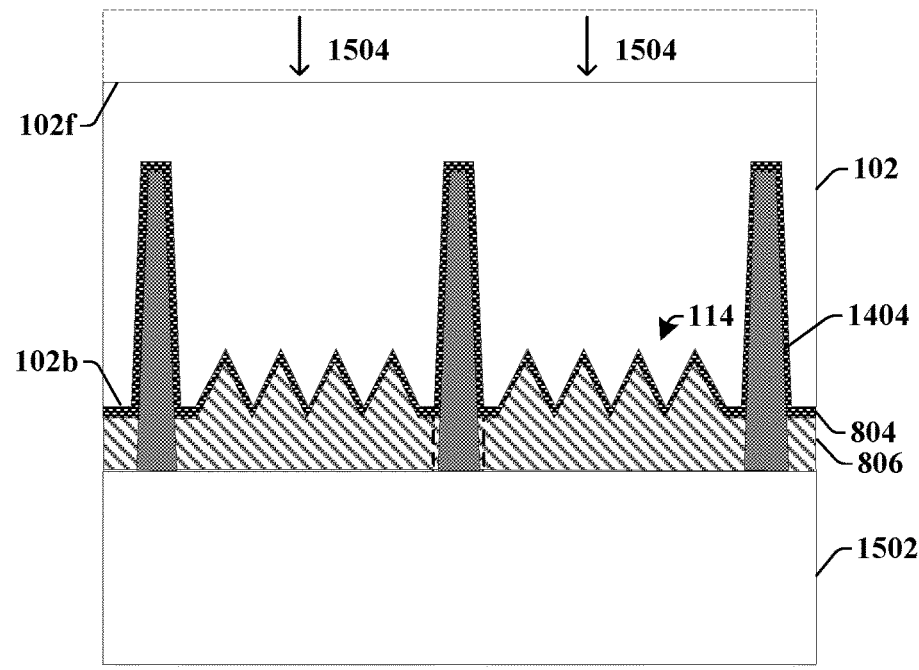

As shown in cross-sectional view 1500 of FIG. 15, the layer of dielectric material 806 is bonded to a support substrate 1502. In some embodiments, the support substrate 1502 may comprise a silicon substrate. In some embodiments, the substrate 902 may be thinned (1504) after bonding to form a semiconductor substrate 102. Thinning the substrate 902 allows for radiation to pass more easily to light sensing elements within the semiconductor substrate 102. In various embodiments, the substrate 902 may be thinned by etching and/or mechanical grinding a front-side 102f of the substrate.

Figure 16:
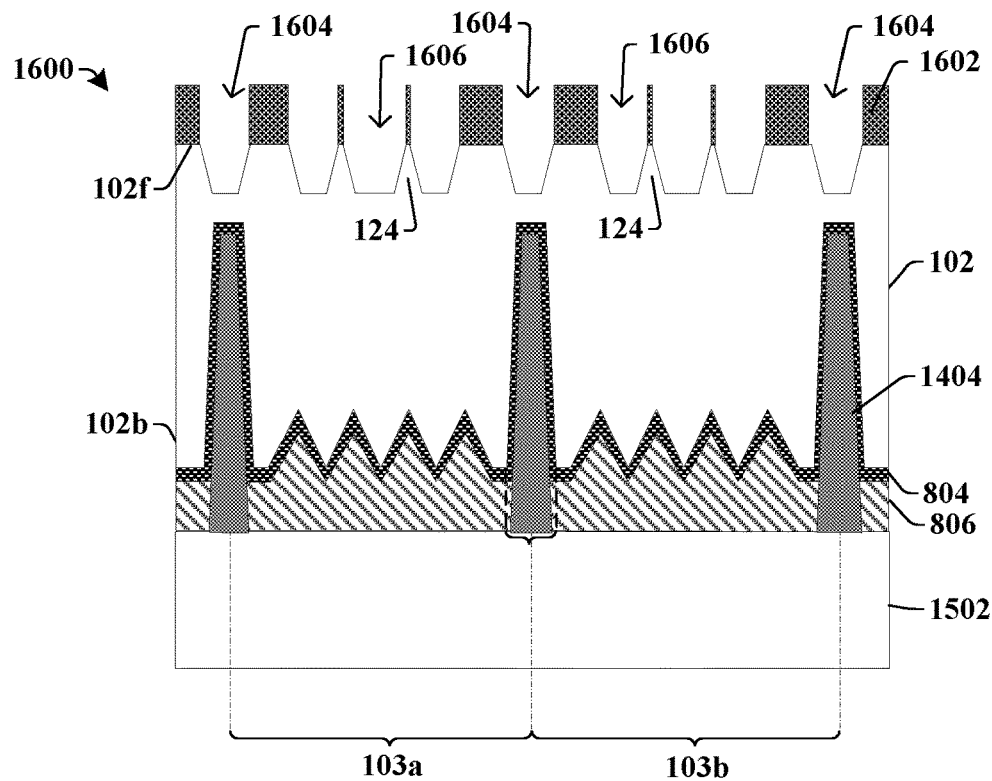

As shown in FIG. 16, a fourth mask structure 1602 is formed, and a fourth etching process is carried out with the fourth mask structure 1602 in place to concurrently form isolation trenches 1604 and depressions 1606 in the front-side 102f of the semiconductor substrate 102. Thus, the depressions 1606 leave an array of semiconductor pillars 124 extending upward from the front-side of the substrate; while the isolation trenches 1604 correspond to ring-like structures that surround the arrays of semiconductor pillars for the individual pixel regions 103a, 103b. The isolation trenches 1604 may be aligned with the grid filled with reflective materials 1404. By forming the pillars and isolation trenches concurrently, a single mask can be used for this step, which can correspond for example, to the isolation structures and depressions having the same depths as one another (see e.g., 830 in FIG. 8). In other embodiments where greater control/differentiation between the trench isolation structures and semiconductor pillars is desired, multiple masks and multiple etches can be used, such that the trench isolation structures and semiconductor pillars can have different depths (see e.g., 830*a* in FIG. 8). For example, a first mask and a first etch can be used to form the depressions 1606, and a second mask and a second etch can be used to form the isolation trenches 1604. However, it is appreciated that a single mask being used simplifies processing, reduces costs, and represents good tradeoffs for many technology nodes.

Figure 17:
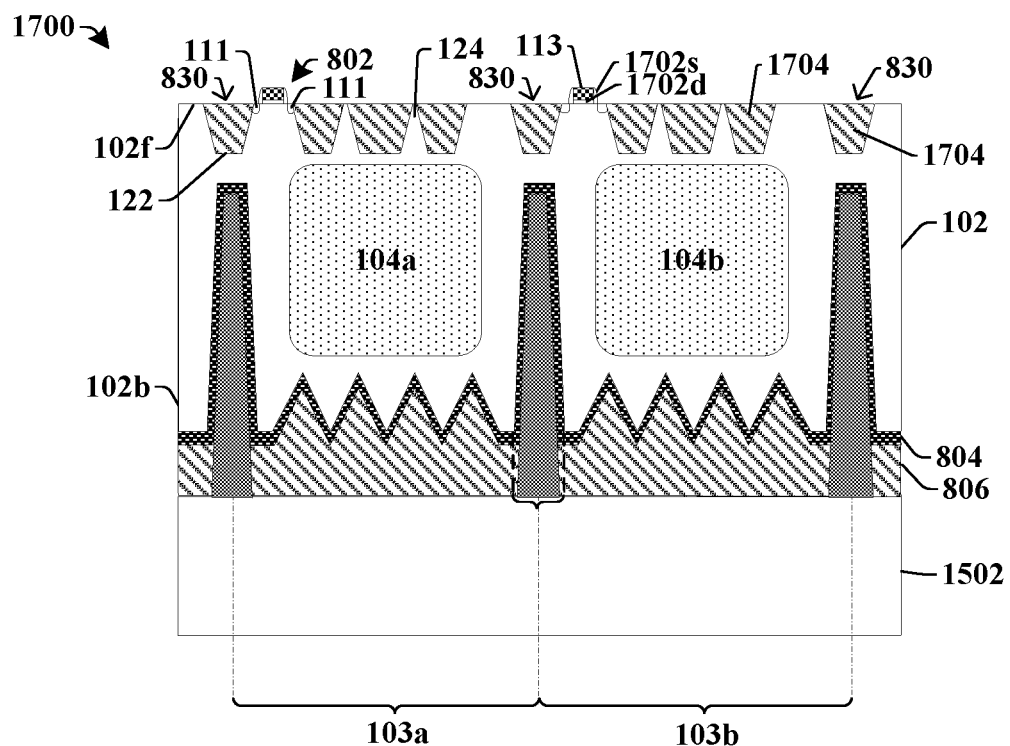

As shown in cross-sectional view 1700 of FIG. 17, one or more dielectric materials 1704, such as silicon dioxide, may be formed to fill the ring-like isolation trenches 1604 and to fill the depressions 1606. The dielectric material can then be planarized to make an upper surface of the dielectric material 1704 co-planar with the front-side 102*f* of the substrate. In this way, trench isolation structures 830, respectively, are formed to surround the arrays of semiconductor pillars 124 for the individual pixel regions 103*a*, 103*b*, respectively. Light sensing elements 104*a*, 104*b* are formed within pixel regions 103*a*, 103*b* of the semiconductor substrate 102. In some embodiments, the light sensing elements 104*a*, 104*b* may comprise photodiodes formed by implanting one or more dopant species into a front-side 102*f* of the semiconductor substrate 102. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

One or more transistors 802 are formed along the front-side 102*f* of the semiconductor substrate 102 over the pixel regions 103*a*-103*b*. In various embodiments, the one or more transistors 802 may correspond to a transfer transistor, a source-follower transistor, a row select transistor, and/or a reset transistor. In some embodiments, the one or more transistors 802 may be formed by forming a gate dielectric film and a gate electrode film on the front-side 102*f* of the semiconductor substrate 102. The gate dielectric film and the gate electrode film are subsequently patterned to form a gate dielectric layer 1702*d* and a gate electrode 113. Sidewall spacers 1702*s* may be formed on the outer sidewalls of the gate electrode 113. In some embodiments, the sidewall spacers 1702*s* may be formed by depositing a spacer layer (e.g., a nitride, an oxide, etc.) onto the front-side 102*f* of the semiconductor substrate 102 and selectively etching the spacer layer to form the sidewall spacer 1702*s*. Source/drain regions 111 are then formed on opposite sides of the sidewall spacers 1702*s*. The source/drain regions 111 can be formed by ion implantation in some embodiments, or can be formed by etching a recesses into the front-side 102*s* of the semiconductor substrate, and then epitaxial regions such as SiGe or SiC regions in the recesses.

Figure 18:
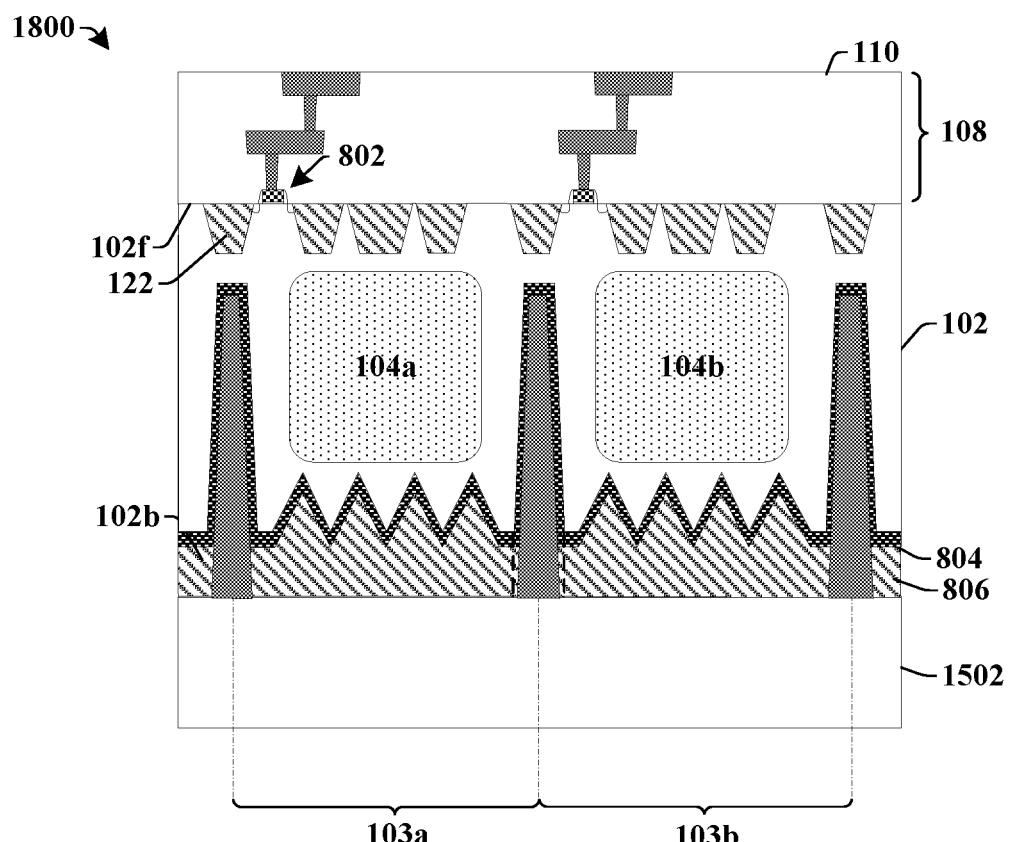

As shown in cross-sectional view 1800 of FIG. 18, a plurality of conductive interconnect layers 112 are formed within an interconnect dielectric structure 110 formed along the front-side 102*f* of the semiconductor substrate 102. In some embodiments, the plurality of conductive interconnect layers 112, such as copper layers, may be formed using a damascene process (e.g., a single damascene process or a dual damascene process). The damascene process is performed by forming an ILD layer over the front-side 102*f* of the semiconductor substrate 102, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the plurality of conductive interconnect layers 112 may comprise tungsten, copper, or aluminum copper, for example.

Figure 19:
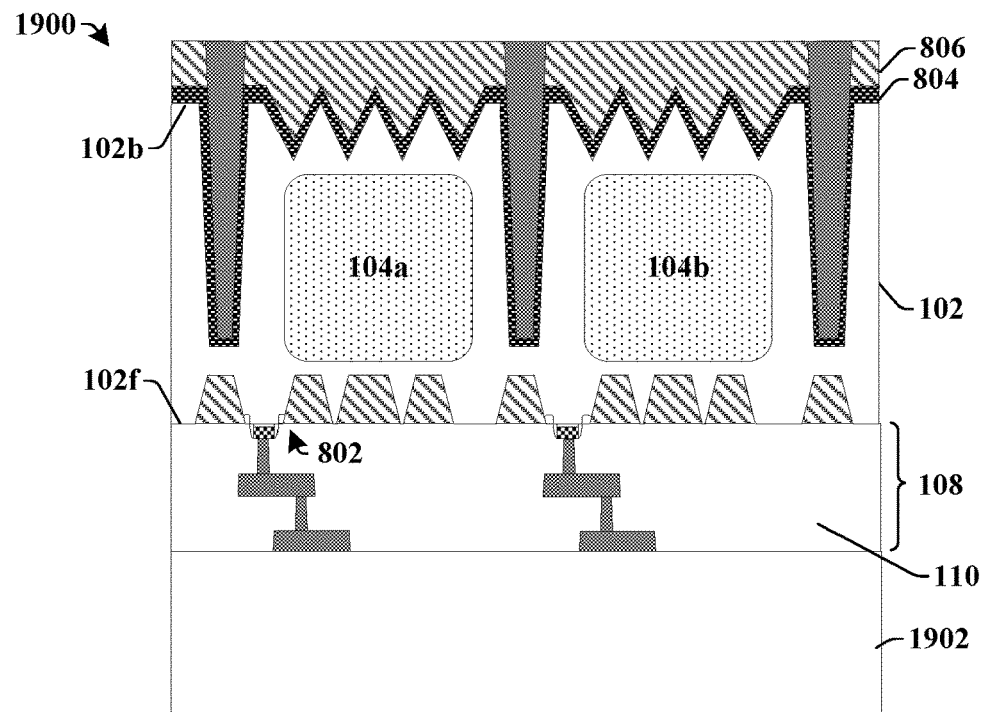

As shown in cross-sectional view 1900 of FIG. 19, the interconnect dielectric structure 110 is bonded to a carrier substrate 1902 and the carrier substrate (1502 of FIG. 15) is subsequently removed. In some embodiments, the bonding process may use an intermediate bonding oxide layer (not shown) arranged between the dielectric structure and the carrier substrate 1902. In some embodiments, the bonding process may comprise a fusion bonding process. In some embodiments, the carrier substrate 1902 may comprise a silicon substrate.

Figure 20:
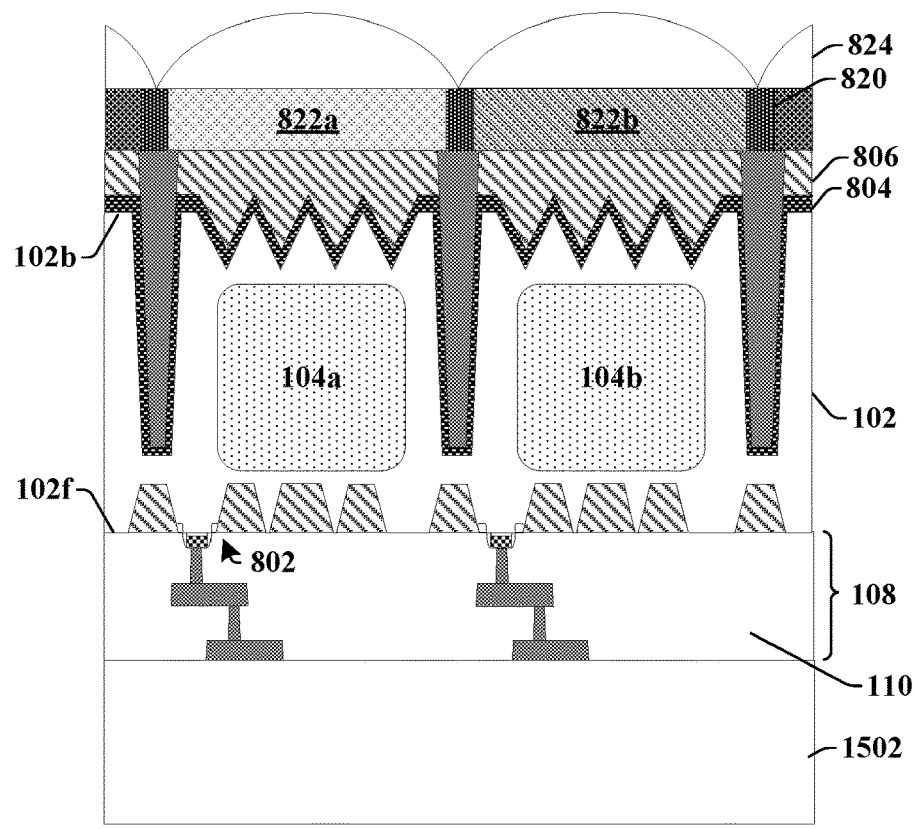

As shown in cross-sectional view 2000 of FIG. 20, a plurality of color filters 822*a*-822*b* are also formed over the layer of dielectric material 806. In some embodiments, the plurality of color filters 822*a*-822*b* may be formed by forming a color filter layer and patterning the color filter layer. The color filter layer is formed of a material that allows for the transmission of radiation (e.g., light) having a specific range of wavelength, while blocking light of wavelengths outside of the specified range.

A plurality of micro-lenses 824 are formed over the plurality of color filters 822*a*-822*b*. In some embodiments, the plurality of micro-lenses 824 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 824 are then formed by selectively etching the micro-lens material according to the micro-lens template.

Figure 21:
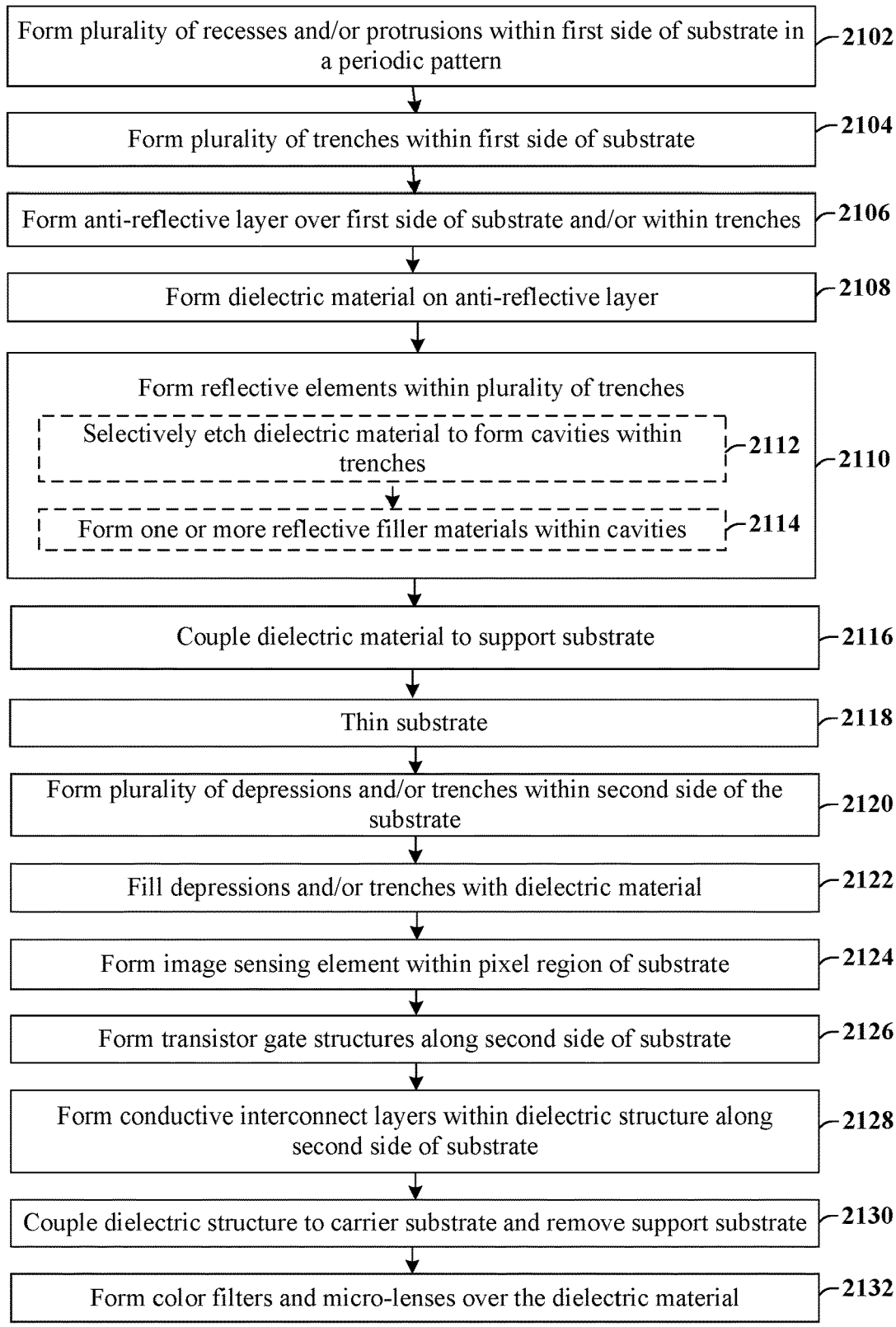
FIG. 21 illustrates a flow diagram of some embodiments of a method of forming an image sensor integrated chip having an absorption enhancement structure and a reflection structure.

FIG. 21 illustrates a flow diagram of some embodiments of a method 2100 of forming an image sensor integrated chip that includes a reflection structure in accordance with some embodiments.

While method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2102, a plurality of recesses and/or protrusions are formed within a first side of the substrate. In some embodiments, the plurality of recesses and/or protrusions may be formed by selectively etching the first side of the substrate according to a patterned masking layer. FIGS. 9-10 illustrate cross-sectional views 900-1000 of some embodiments corresponding to act 2102.

At 2104, a plurality of trenches are formed within the first side of the substrate. In some embodiments, the plurality of trenches are formed by selectively etching the first side of the substrate according to a second masking layer. FIG. 11 illustrates a cross-sectional view 1100 of some embodiments corresponding to act 2104.

At 2106, an anti-reflective layer is formed over the first side of the substrate. In some embodiments, the anti-reflective layer may also be formed within the plurality of trenches. FIG. 12 illustrates a cross-sectional view 1200 of some embodiments corresponding to at 2106.

At 2108, a layer of dielectric material is formed on the anti-reflective layer. FIG. 13 illustrates a cross-sectional view 1300 of some embodiments corresponding to at 2108.

At 2110, reflective elements are formed within the plurality of trenches. FIG. 14 illustrates a cross-sectional view 1400 of some embodiments corresponding to act 2110. At 2112, layer of dielectric material is removed from within the plurality of trenches to form cavities within the plurality of trenches. At 2114, one or more reflective filler materials are formed within the cavities.

At 2116, the layer of dielectric material is coupled to a support substrate. FIG. 15 illustrates a cross-sectional view 1500 of some embodiments corresponding to act 2116.

At 2118, the substrate is thinned to reduce a thickness of the substrate. FIG. 15 illustrates a cross-sectional view 1500 of some embodiments corresponding to act 2118.

At 2120, a plurality of depressions and/or trenches are formed with a second side of the substrate. FIG. 16 illustrates a cross-sectional view 1600 of some embodiments corresponding to act 2120.

At 2122, the plurality of depressions and/or trenches are filled with a dielectric material, to establish a reflective structure along the second side of the substrate. FIG. 17 illustrates a cross-sectional view 1600 of some embodiments corresponding to act 2122.

At 2124, a light sensing element is formed within a pixel region of a substrate. FIG. 17 illustrates a cross-sectional view 1700 of some embodiments corresponding to act 2124.

At 2126, one or more transistor gate structures are formed along the second side of the substrate over the light sensing element. FIG. 17 illustrates a cross-sectional view 1700 of some embodiments corresponding to act 2126.

At 2128, a plurality of conductive interconnect layers are formed within a dielectric structure along the second side of the substrate. FIG. 18 illustrates a cross-sectional view 1800 of some embodiments corresponding to act 2128.

At 2130, the dielectric structure is coupled to a carrier substrate and the support substrate is removed. FIG. 19 illustrates a cross-sectional view 1900 of some embodiments corresponding to act 2130.

At 2132, color filters and micro-lenses are formed over the layer of dielectric material of the absorption enhancement element. FIG. 20 illustrates a cross-sectional view 2000 of some embodiments corresponding to act 2132.

Some embodiments relate to an integrated chip, which includes a light sensing element arranged within a substrate. An absorption enhancement structure is arranged within the substrate along a back-side of the substrate, and an interconnect structure is arranged along a front-side of the substrate and spaced apart from the absorption enhancement structure by the light sensing element. A reflection structure, which includes a dielectric structure and a plurality of semiconductor pillars that matingly engage corresponding recesses in the dielectric structure, is arranged along the front-side of the substrate and is spaced between the light sensing element and the interconnect structure. The plurality of semiconductor pillars and the dielectric structure are collectively configured to reflect incident light that has passed through the absorption enhancement structure and through the light sensing element back towards the light sensing element before the incident light strikes the interconnect structure.

Some embodiments relate to an integrated chip, which includes a semiconductor substrate having a first side and a second side. A plurality of pixel regions are arranged in an array within the substrate. Each pixel region includes a light sensing element disposed between the first side of the substrate and the second side of the substrate. An absorption enhancement structure is arranged over the light sensing element and along the first side of the substrate. The absorption enhancement structure includes a plurality of protrusions extending outwardly from the first side of the substrate. A trench isolation structure is disposed on the second side of the substrate and perimeterally surrounds the light sensing element. A reflection structure is arranged along the second side of the substrate under the light sensing element. The reflection structure is perimeterally surrounded by the trench isolation structure and includes a plurality of semiconductor pillars configured to reflect incident light that has passed through the absorption enhancement structure and through the light sensing element back towards the light sensing element.

Some embodiments relate to an integrated chip including semiconductor substrate having a front-side and a back-side. A light sensing element is arranged within the substrate between the front-side and the back-side, and an absorption enhancement structure includes a plurality of protrusions along the back-side of the substrate. A color filter element is disposed over the absorption enhancement structure, and a microlens is disposed over the color filter element. An interconnect structure is disposed along the front-side of the substrate. The interconnect structure is separated from the absorption enhancement structure by the light sensing element. A reflection structure is arranged along the front-side of the substrate and is spaced between the light sensing element and the interconnect structure. The reflection structure includes a plurality of semiconductor pillars which extend from the front-side of the substrate and which matingly engage corresponding depressions in a dielectric structure along the front-side of the substrate. The plurality of semiconductor pillars are collectively configured to reflect incident light that has passed through the absorption enhancement structure and through the light sensing element back towards the light sensing element.

Some embodiments relate to a method of forming an image sensor integrated chip. In this method, a first etching process is performed on a first side of a substrate to define a plurality of protrusions along the first side of the substrate. A first dielectric material is formed to engage the protrusions and establish an absorption enhancement structure along the first side of the substrate. A second etching process is performed on a second side of the substrate to define a plurality of semiconductor pillars along the second side of the substrate. A material, which has a refractive index that differs from a refractive index of the substrate, is formed surrounding the plurality of semiconductor pillars to establish a reflective structure. A light sensing element is formed in the substrate between the first side of the substrate and the second side of the substrate.

Some embodiments relate to a method of forming an image sensor integrated chip. In this method, a light sensing element is formed in a semiconductor substrate between a front-side of the semiconductor substrate and a back-side of the semiconductor substrate. A first etching process is performed on the front-side of the semiconductor substrate to leave a plurality of semiconductor pillars extending outward from a depressed portion of the front-side of the substrate. A first dielectric material, which has a refractive index that differs from a refractive index of the semiconductor substrate, is formed along the depressed portion of the front-side of the substrate to surround each of the plurality of semiconductor pillars and thereby establish a reflective structure. A surface of the first dielectric material is planarized. An interconnect structure is formed along the planarized surface of the first dielectric material. The interconnect structure includes a plurality of metal lines disposed in an interconnect dielectric structure. A color filter element is formed along the back-side of the semiconductor substrate. A microlens structure is formed adjacent to the color filter element. The microlens is spaced apart from the reflective structure by the color filter element.

Some embodiments relate to an integrated chip which includes a semiconductor substrate having a first side and a second side. A light sensing element is arranged within the substrate between the first side and the second side, and a color filter element or microlens is disposed over the first side. A reflection structure is arranged along the second side of the substrate, such that the light sensing element separates the reflection structure from the color filter element or microlens. The reflection structure includes a plurality of semiconductor pillars which extend from the second side of the substrate and which matingly engage corresponding depressions in a dielectric structure along the second side of the substrate. The plurality of semiconductor pillars are configured to reflect incident light that has passed through the color filter element or microlens and through the light sensing element back towards the light sensing element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a light sensing element arranged within a substrate;
an absorption enhancement structure arranged within the substrate along a back-side of the substrate;
an interconnect structure arranged along a front-side of the substrate and spaced apart from the absorption enhancement structure by the light sensing element; and
a reflection structure comprising a dielectric structure and a plurality of semiconductor pillars that matingly engage the dielectric structure, the dielectric structure and the semiconductor pillars being arranged along the front-side of the substrate and being spaced between the light sensing element and the interconnect structure, wherein the plurality of semiconductor pillars and the dielectric structure are collectively configured to reflect incident light that has passed through the absorption enhancement structure and through the light sensing element back towards the light sensing element before the incident light strikes the interconnect structure.

2. The integrated chip of claim 1, wherein the plurality of semiconductor pillars are each in a shape of a cone, frustum cone, pyramid, frustum pyramid, cylinder, cube, or box.

3. The integrated chip of claim 1, wherein the plurality of semiconductor pillars are circular, square, or square-like with rounded corners, as viewed from above.

4. The integrated chip of claim 1, wherein the absorption enhancement structure comprises a non-planar surface comprising a plurality of protrusions defining a plurality of depressions between adjacent protrusions.

5. The integrated chip of claim 4, wherein each of the plurality of protrusions is cone-shaped or pyramid shaped, and wherein each of the plurality of semiconductor pillars is cone-frustum shaped or pyramid-frustum shaped.

6. The integrated chip of claim 1, wherein first and second semiconductor pillars of the plurality of semiconductor pillars are nearest neighbors to one another and each has a corresponding semiconductor pillar width as measured between their respective outer sidewalls.

7. The integrated chip of claim 6, wherein the first and second semiconductor pillars are spaced apart by a trench spacing, and wherein the trench spacing between the first and second semiconductor pillars is the same as a trench spacing for all nearest neighbor semiconductor pillars under the light sensing element.

8. The integrated chip of claim 7, wherein the semiconductor pillar width is approximately a factor of two larger than the trench spacing.

9. The integrated chip of claim 1, wherein a cross-sectional width of a semiconductor pillar as measured at the front-side of the substrate is equal to a cross-sectional width of a bottommost surface of a depression, such that the semiconductor pillars and the depressions are inverted relative to one another and have cross-sections that are congruous.

10. An integrated chip, comprising:
a semiconductor substrate comprising a first side and a second side;
a plurality of pixel regions arranged in an array within the substrate, wherein each pixel region comprises:
a light sensing element disposed between the first side of the substrate and the second side of the substrate;
an absorption enhancement structure arranged over the light sensing element and along the first side of the substrate, the absorption enhancement structure comprising a plurality of protrusions extending outwardly from the first side of the substrate;
a reflection structure along the second side of the substrate under the light sensing element, wherein the reflection structure comprises a plurality of semiconductor pillars configured to reflect incident light that has passed through the absorption enhancement structure and through the light sensing element back towards the light sensing element.

11. The integrated chip of claim 10, further comprising:
an interconnect structure along the second side of the substrate, the interconnect structure comprising an interconnect dielectric structure and a plurality of metal lines.

12. The integrated chip of claim 10, wherein the plurality of semiconductor pillars are each in a shape of a cone, frustum cone, pyramid, frustum pyramid, cylinder, cube, or box.

13. The integrated chip of claim 10, wherein the plurality of semiconductor pillars are circular, square, or square-like with rounded corners as viewed from above.

14. The integrated chip of claim 10, wherein each of the plurality of protrusions is cone-shaped or pyramid shaped, and wherein each of the plurality of semiconductor pillars is cone-frustum shaped or pyramid-frustum shaped.

15. The integrated chip of claim 10, wherein a protrusion of the plurality of protrusions has a protrusion sidewall that meets the first side of the substrate at a first acute angle, and at least one semiconductor pillar of the plurality of semiconductor pillars has a semiconductor pillar sidewall that meets the second side of the substrate at a second acute angle, the second acute angle being less than the first acute angle.

16. The integrated chip of claim 10, wherein each of the plurality of pillars share a first depth.

17. The integrated chip of claim 10, wherein the plurality of semiconductor pillars of the reflection structure matingly engage a plurality of depressions, respectively in a dielectric structure along the second side of the substrate.

18. The integrated chip of claim 17, wherein the dielectric structure has a surface that is co-planar with the second side of the substrate.

19. The integrated chip of claim 10, further comprising:
a hard mask disposed over along an outermost tip of a pillar of the plurality of semiconductor pillars, the hard mask having a surface that is co-planar with the second side of the substrate.

20. An integrated chip, comprising:
a semiconductor substrate comprising a front-side and a back-side;
a light sensing element arranged within the substrate between the front-side and the back-side;
an absorption enhancement structure comprising a plurality of protrusions along the back-side of the substrate;
a color filter element disposed over the absorption enhancement structure;
a microlens disposed over the color filter element;
an interconnect structure disposed along the front-side of the substrate, the interconnect structure separated from the absorption enhancement structure by the light sensing element; and
a reflection structure along the front-side of the substrate and spaced between the light sensing element and the interconnect structure, the reflection structure comprising a plurality of semiconductor pillars which extend from the front-side of the substrate and which matingly engage corresponding depressions in a dielectric structure along the front-side of the substrate, the plurality of semiconductor pillars collectively configured to reflect incident light that has passed through the absorption enhancement structure and through the light sensing element back towards the light sensing element.

* * * * *